United States Patent [19]

Kourimsky

[11]  4,355,853

[45]  Oct. 26, 1982

[54] ELECTRICAL JUNCTION BOX

[75] Inventor: Friedrich J. A. Kourimsky, Bensheim, Fed. Rep. of Germany

[73] Assignee: AMP Incorporated, Harrisburg, Pa.

[21] Appl. No.: 111,739

[22] Filed: Jan. 14, 1980

Related U.S. Application Data

[63] Continuation of Ser. No. 906,535, May 17, 1978, abandoned.

[30] Foreign Application Priority Data

May 21, 1977 [GB] United Kingdom ............... 21534/77

[51] Int. Cl.³ .............................................. H01R 13/46
[52] U.S. Cl. ............................ 339/17 LM; 339/17 R; 339/17 M; 339/122 R
[58] Field of Search ............... 361/399, 394, 395, 393; 339/119, 193 P, 17 R, 17 C, 17 L, 17 LC, 17 LM, 184 M, 76, 78, 126 R, 137, 122; 200/307

[56] References Cited

U.S. PATENT DOCUMENTS

| | | | |
|---|---|---|---|
| 2,968,782 | 1/1961 | Herrmann | 339/184 R X |
| 3,270,251 | 8/1966 | Evans | 361/393 |
| 3,368,115 | 2/1968 | Hoffman | 339/17 N X |
| 3,372,308 | 3/1968 | Noschese et al. | 339/17 N X |
| 3,467,892 | 9/1969 | Sprude et al. | 339/17 N |
| 3,576,520 | 4/1971 | Stauffer | 339/126 R X |
| 3,725,843 | 4/1973 | Johnson | 339/17 LM X |
| 3,833,839 | 9/1974 | Debaigt | 361/399 |
| 3,858,155 | 12/1974 | Lacan | 361/394 X |
| 3,900,769 | 8/1975 | Russo, Jr. | 361/395 |
| 3,950,053 | 4/1976 | Brighenti | 339/126 R X |
| 4,000,447 | 12/1976 | Codrino | 361/380 |
| 4,047,242 | 9/1977 | Jakob | 361/399 X |
| 4,153,127 | 5/1979 | Klink | 339/184 M X |

Primary Examiner—John McQuade
Assistant Examiner—John S. Brown
Attorney, Agent, or Firm—Frederick W. Raring

[57] ABSTRACT

A junction box assembly for an automobile comprising a main junction box releasably coupled mechanically and electrically to an auxiliary junction box, the main junction box comprising an insulating housing enclosing at least one circuit board providing distribution networks for electrical supplies to main appliances and having plugs or sockets for connection to sockets or plugs terminating main appliance leads, and the auxiliary junction box comprising an insulating housing enclosing at least one circuit board providing distribution networks for electrical supplies to auxiliary appliances, the housing of the main junction box having means projecting from a rear face to attach the main junction box to the bulkhead of an automobile engine compartment.

6 Claims, 9 Drawing Figures

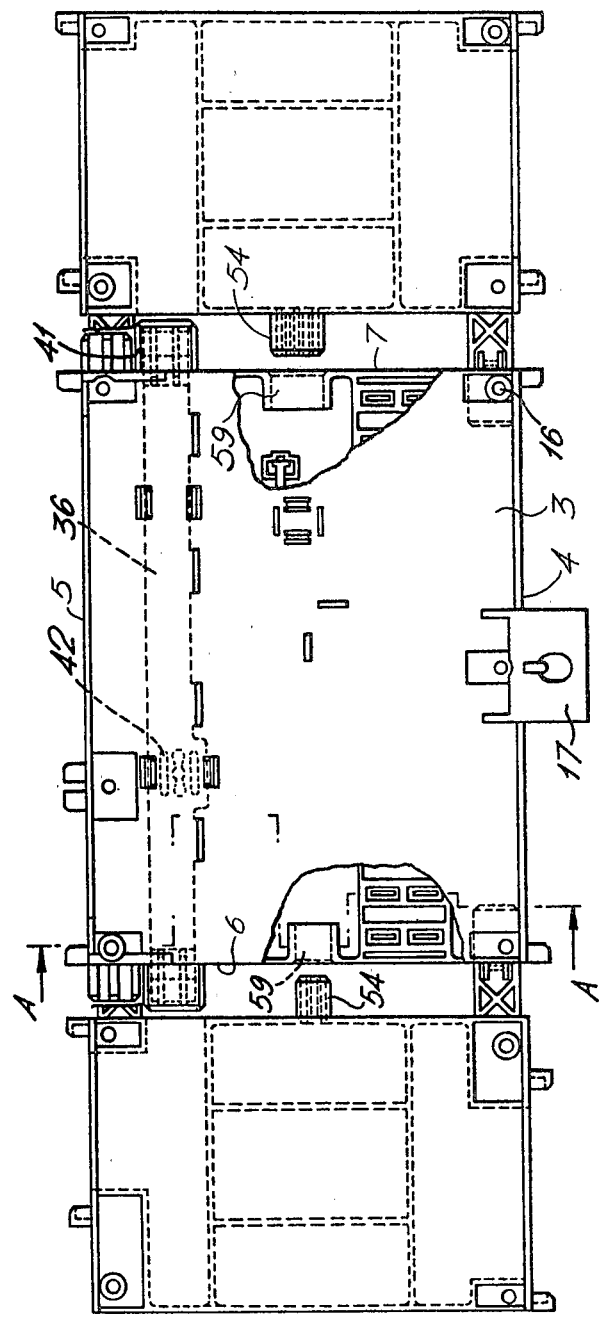

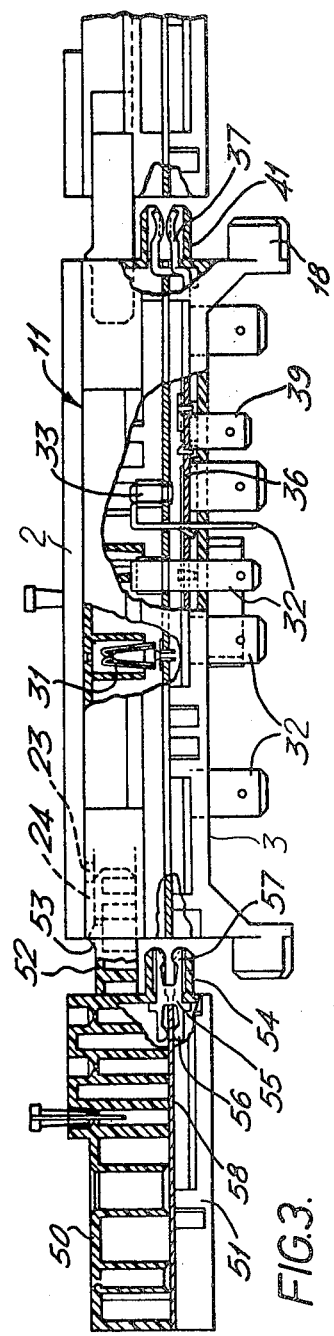
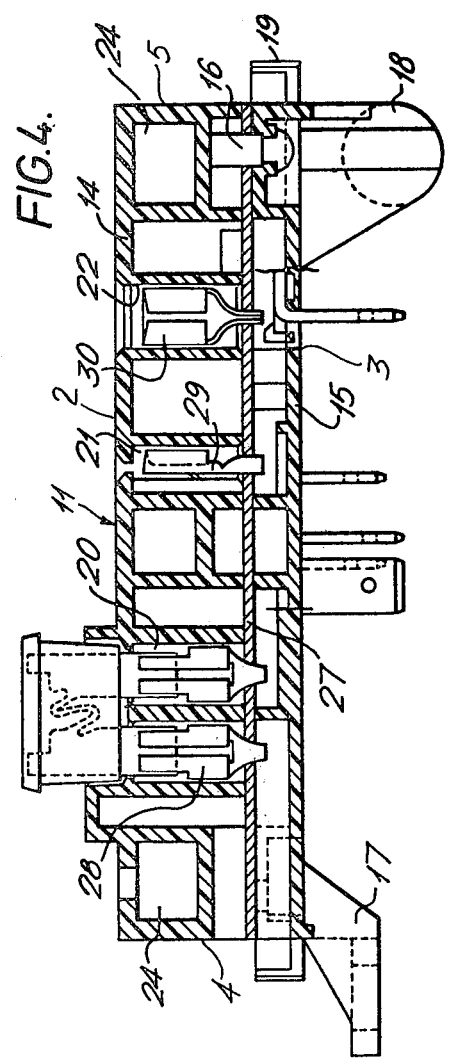

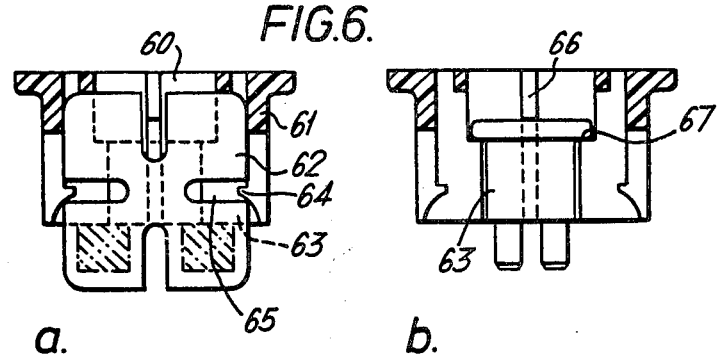
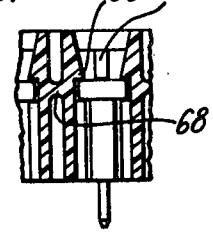
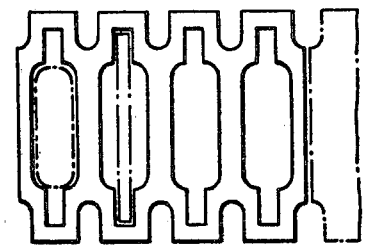
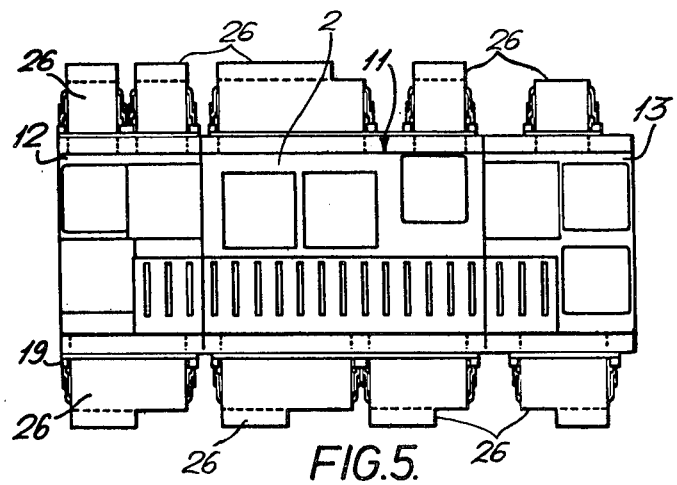

ELECTRICAL JUNCTION BOX

This is a continuation, of application Ser. No. 906,535, filed May 17, 1978, now abandoned.

The invention relates to junction boxes and particularly but not solely to junction boxes for use in motor vehicles.

It is known to provide junction boxes which comprise an insulating housing enclosing at least one circuit board providing distribution networks for the electrical supplies to basic automobile appliances (e.g. lights, windscreen wipers) instead of the conventional central wire harnesses which consisted of networks of individual wires.

In addition to the cost savings achieved as a result of the use of less materials and labor, the junction box affords a substantial saving in space when compared with the conventional wire harness and can conveniently be located in the engine compartment instead of behind the instrument panel. The use of diagnostic equipment is also facilitated.

However, in the interests of cost saving, it is often desirable to provide a junction box assembly which can accommodate distribution networks for both the main appliances (e.g. lights, windscreen wipers, etc.) and auxiliary appliances (e.g. air conditioner, headlight wipers) for some vehicles such as export or luxury models without incurring the expense of making such provision where not required.

According to the invention, a main junction box comprises an insulating housing enclosing at least one circuit board providing distribution networks for electrical supplies to main appliances and having plugs or sockets for connection to sockets or plugs terminating main appliance leads, the main junction box having means releasably to couple the main junction box mechanically and electrically to one or more auxiliary junction boxes of similar construction which provide distribution networks for electrical supplies to auxiliary appliances.

The circuit boards may be printed circuit boards or comprise metal strips mounted on an insulating carrier.

Preferably, the housing has means projecting from a rear face to attach the main junction box to the bulkhead of an automobile engine compartment and the coupling means are adapted to operate to permit coupling and uncoupling of the or each auxiliary box with the main box attached to the bulkhead and the circuit board(s) of the or each auxiliary junction box and the circuit board of the main junction box in parallel planes and in coplanar relation, respectively.

Coupling may be achieved by movement of the or each auxiliary junction box in directions perpendicular to or parallel with the plane of the circuit board of the main junction box. In the former case the housings of the respective coupling junction boxes may be adapted to dovetail together.

According to another aspect of the invention a junction box assembly for an automobile comprises a main junction box releasably coupled mechanically and electrically to an auxiliary junction box, the main junction box comprising an insulating housing enclosing at least one circuit board providing distribution networks for electrical supplies to main appliances and having plugs or sockets for connection to sockets or plugs terminating main appliance leads, and the auxiliary junction box comprising an insulating housing enclosing at least one circuit board providing distribution networks for electrical supplies to auxiliary appliances, the housing of the main junction box having means projecting from a rear face to attach the main junction box to the bulkhead of an automobile engine compartment.

A fuse holder adapted to receive either a p.c.b. or cartridge type fuse may be provided in strip form enabling an appropriate number of fuse holders to be severed from the strip and applied as a group to the junction box assembly.

A specific example of a junction box according to the invention will now be described with reference to the accompanying drawing in which:

FIG. 2 is an underplan view;

FIG. 3 is a side elevation partly in cross-section;

FIG. 4 is a cross-sectional view of the main junction box taken along line A—A of FIG. 3;

FIG. 5 is a plan view of the junction box assembly also showing the location of external connectors; and, FIG. 6 shows various views of a fuse holder in strip and loose-piece form adapted to receive either a printed circuit board fuse or a cartridge fuse.

Figure 1:
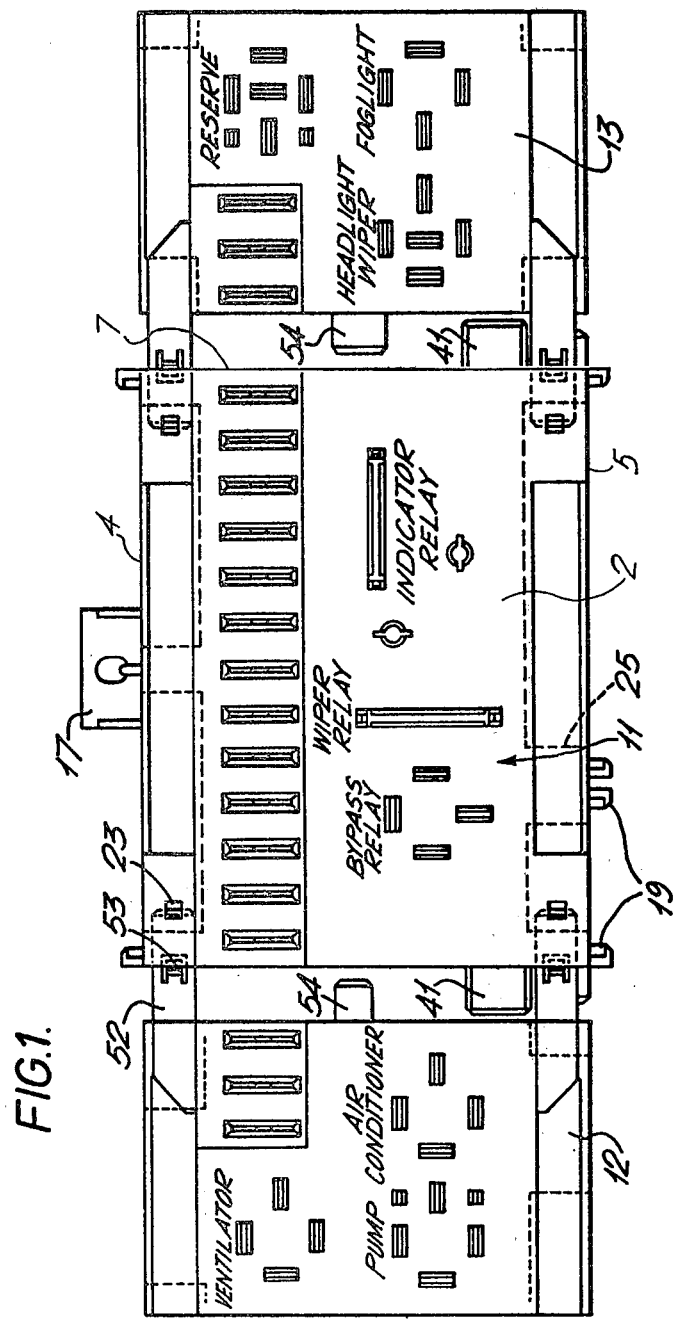
FIG. 1 is a plan view of the main junction box with auxiliary junction boxes aligned for coupling therewith.

The junction box assembly comprises a main box 11 and auxiliary boxes 12 and 13 releasably coupled mechanically and electrically to the main box. The main box 11 has main panel members 2, 3 which are oppositely directed as shown in FIGS. 1-3. Sidewalls 4, 5 and endwalls 6, 7 extend between the main panel members. The sidewalls and endwalls are comprised of wall portions of housing sections 14, 15 described below.

The main box 11 includes upper and lower housings 14,15 respectively, each molded in one piece from suitable plastics material and fixed together by an ultrasonic welding technique for which plastics studs 16 are provided on the upper housing. A bolt-receiving mounting flange 17 extends from one side of the lower housing and cylindrical feet 18 from each end of the other side, the feet being for receipt in mounting channels defined on the engine compartment bulkhead. Connector mounting hooks 19 extend at intervals from opposite sides of the lower housing at each end of sockets 25 for external connector 26.

The upper housing 14 is molded with a series of terminal receiving cavities 20,21,22 open to the top and at opposite sides of each end with coupling sockets 24 open to the respective ends. A printed circuit board 27 is sandwiched between upper and lower housings and groups of tab receptacles 28,29,30 are soldered to the p.c.b. and located in the cavities 20,21,22 respectively. Other terminals such as a fork receptacle 31 for a p.c.b. may be soldered to the p.c.b. 27. Groups of tab terminals 32 having resilient triangular section mounting portions attached to posts 33, soldered to the p.c.b., extend through apertures in the lower housing. A stamped and formed metal bus 36 extends along the housing and is formed at opposite ends into fork contacts 37 which are located in shrouds 41 and protrude from opposite ends of the main box. A U-shaped spring (not shown) may extend through slots 42 for connection to the bus to provide a high current tap to an external heavy current carrier. In addition, commoning tabs 39 extend through apertures in the lower housing.

The auxiliary boxes 12,13 are of similar, though not identical, construction each having upper and lower housings 50,51 molded in one piece from plastics material and fixed together by an ultrasonic welding technique. Latch arms 52 are integrally molded with the upper housings 50 and extend from opposite sides of ends to be coupled with the main box. The latch arms are integrally formed with detents 53. A printed circuit board 58 (hereinafter referred to as a p.c.b.) is sandwiched between the upper and lower housings and carries various terminals (not shown). A coupling end of each housing has a protruding shroud 54 for a stamped and formed coupling terminal 55 which comprises two forks 56,57 opening to opposite directions, one fork 56 connecting to the auxiliary p.c.b. 58 and the other 57 connecting to the p.c.b. 27.

To assemble the auxiliary junction boxes with the main junction box, the boxes are aligned end to end as shown in FIGS. 1 and 2 and pushed together causing the detents on the latch arms to snap into locking apertures 23 in the walls of sockets 24. Simultaneously, the forks 57 of the auxiliary box connect to the p.c.b. 27 of the main box and the forks 37 of the bus strip of the main box connect to the p.c.b. 27. It should be noted that shrouds 54 of each auxiliary box and complementary apertures 59 of the main box are of different sizes to prevent mismatching of the auxiliary boxes with the main box.

The groups of terminals may be associated with the functions indicated in the drawing and a particular fuse holder adapted for use with the junction box is shown in FIG. 6.

The fuse holder is molded in one piece from plastics material with a fuse receiving through cavity 60 of reduced width at each end 63. Detents 64 protrude into each end of the cavity remote from a top and detent shoulders 66, protrude into the cavity intermediate the ends opposite a shoulder 67. The detents 64 and 66 have cam surfaces facing the bottom and top of the cavity, respectively, so that a p.c.b. fuse 62 can be pushed into the cavity from below with the detents snapping into the slots 65 on the p.c.b. and a small cartridge fuse 63 can be pushed into the cavity from above with the detent shoulder 66 snapping over the fuse 63 to lock it against shoulder 67.

The fuse holder can conveniently be manufactured in strip form, the housings being connected by web 68, which may readily be severed to permit a group of fuse holders with their fuses to be connected to the boxes.

It should be noted that the p.c.b. fuses may be double ended, rotation of the p.c.b. fuse being necessary to provide another live fuse after one has blown.

The junction box is particularly suitable for use with external connectors described in our U.S. Pat. No. 4,053,197.

What is claimed is:

1. An automotive electrical junction box means comprising:
   a main junction box comprising an insulating housing having a circuit board contained therein,
   said housing having oppositely directed parallel main panel members, parallel oppositely directed sidewalls and parallel oppositely directed endwalls extending between said main panel members,
   said circuit board extending parallel to, and being between, said main panel members, said circuit board having side edges which extend along said sidewalls and having end edges which extend along said endwalls,
   a bus bar conductor in said housing extending between said end edges, circuit board terminal means on said circuit board, said circuit board terminal means comprising terminal tabs and terminal receptacles, said terminal tabs and said terminal receptacles extending normally of said circuit board towards said main panel members,
   contact terminals on the ends of said bus bar, said contact terminals extending beyond said end edges of said circuit board and being mateable with complementary terminal means on auxiliary junction boxes and,
   mechanical coupling means on said endwalls, said mechanical coupling means being cooperable with complementary coupling means on auxiliary junction boxes.

2. Junction box means as set forth in claim 1, said insulating housing of said main junction box comprising two housing parts, each of said housing parts comprising one of said main panel members and flanges extending therefrom, said flanges forming said endwalls and said sidewalls of said housing.

3. A junction box means as set forth in claim 1, said terminal tabs extending normally of, and beyond, one of said main panel members, said terminal receptacles extending towards the other panel member and being fully contained in said housing, said other panel member having openings therein in alignment with said terminal receptacles to permit insertion of complementary terminal devices into said terminal receptacles.

4. Junction box means as set forth in claim 3 comprising auxiliary junction boxes coupled to said main junction box by said coupling means, said main junction box providing distribution networks for electrical supplies to main appliances, said auxiliary junction boxes providing distribution networks for auxiliary appliances.

5. Junction box means as set forth in claim 1, said mechanical coupling means on said endwalls comprising latching apertures dimensioned to receive complementary latch arms with latching detents.

6. Junction box means as set forth in claim 5, said contact terminals on said ends of said bus bar comprising fork contact extending normally of said endwalls whereby said main junction box is adapted to receive said auxiliary junction boxes upon movement of said auxiliary junction boxes towards said endwalls in the plane of said main junction box.

* * * * *